United States Patent [19]
Yamazaki et al.

[11] Patent Number: 5,096,851
[45] Date of Patent: Mar. 17, 1992

[54] METHOD OF PACKAGING AN ELECTRONIC DEVICE USING A COMMON HOLDER TO CARRY THE DEVICE IN BOTH A CVD AND MOLDING STEP

[75] Inventors: Shunpei Yamazaki, Tokyo; Noriya Ishida, Atsugi; Mitsunori Sakama, Hiratsuka; Mari Sasaki, Atsugi, all of Japan

[73] Assignee: Semiconductor Energy Laboratory Co., Ltd., Kanagawa, Japan

[21] Appl. No.: 572,331

[22] Filed: Aug. 24, 1990

Related U.S. Application Data

[62] Division of Ser. No. 353,751, May 18, 1989, abandoned.

[30] Foreign Application Priority Data

May 19, 1988 [JP] Japan .................. 63-124360
May 19, 1988 [JP] Japan .................. 63-124361

[51] Int. Cl.⁵ .................. H01L 21/30; H01L 21/56; H01L 21/58; H01L 21/60
[52] U.S. Cl. .................. 437/205; 437/207; 437/925; 118/728; 204/192.25
[58] Field of Search .................. 357/71, 72, 74, 68; 427/39, 117, 99; 204/192.25, 298.15; 437/243, 205, 207, 925; 118/728

[56] References Cited

U.S. PATENT DOCUMENTS

| | | | |
|---|---|---|---|
| 4,056,681 | 11/1977 | Cook, Jr. .................. | 174/52 |
| 4,091,407 | 5/1978 | Williams et al. .................. | 357/54 |
| 4,396,934 | 8/1983 | Nishida et al. .................. | 357/54 |
| 4,580,157 | 4/1986 | Honda .................. | 357/84 |
| 4,618,878 | 10/1986 | Aoyama et al. .................. | 357/71 |
| 4,625,227 | 11/1986 | Hara et al. .................. | 357/68 |
| 4,729,010 | 3/1988 | Tsuchiya et al. .................. | 357/70 |
| 4,971,667 | 11/1990 | Yamazaki .................. | 427/38 |

FOREIGN PATENT DOCUMENTS

| | | |
|---|---|---|
| 59231810 | 12/1980 | Japan . |
| 56-27941 | 3/1981 | Japan . |
| 57-210646 | 12/1982 | Japan .................. 357/72 |
| 59-231840 | of 1984 | Japan . |
| 60-107841 | 6/1985 | Japan . |
| 61-148824 | 7/1986 | Japan . |
| 61-258436 | 11/1986 | Japan . |

OTHER PUBLICATIONS

Wolf, S, and Tauber, R. N. *Silicon Processing for the VLSI Era,* CA., Lattice Press, 1986, pp. 349 and 358, TK 7874,W6 1986.

Primary Examiner—Olik Chaudhuri
Assistant Examiner—David E. Graybill
Attorney, Agent, or Firm—Sixbey, Friedman, Leedom & Ferguson

[57] ABSTRACT

An improved electric device and manufacturing method for the same are described. The device is for example an IC chip clothed in moulding. In advance of the moulding process, the IC chip is coated with silicon nitride in order to protect the IC chip from moisture invaded through cracks or gaps. The coating of silicon nitride is carried out by plasma CVD. Particularly, an AC voltage is applied to the IC chip during deposition for the purpose of obtaining an excellent property of the silicon nitride coating.

4 Claims, 3 Drawing Sheets

METHOD OF PACKAGING AN ELECTRONIC DEVICE USING A COMMON HOLDER TO CARRY THE DEVICE IN BOTH A CVD AND MOLDING STEP

This application is a divisional of Ser. No. 07/353,751, filed May 18, 1989, now abandoned.

BACKGROUND OF THE INVENTION

The present invention relates to an electric device and manufacturing method of the same.

Integrated semiconductor circuits are most important electric devices which have been broadly used in a variety of fields. One of the problems from the view point of reliability is the invasion of moisture or other impurities into the IC chips embedded in moulding. The invasion takes place through cracks or gaps occuring in the moulding to form paths from the outside of the moulding to the surface of the IC chip. The moisture which reachs the IC surface causes undesirable corrosion of the semiconductor constituting the IC chip and leads to malfunction of the chip.

SUMMARY OF THE INVENTION

It is therefore an object of the present invention to provide a reliable electric device and manufacturing the same which is immune to moisture or other impurities invading through cracks or other paths of a package enclosing the device.

BRIEF DESCRIPTION OF THE DRAWING

This invention can be better understood from the following detailed description when read in conjunction with the drawing in which.

DETAILED DESCRIPTION OF THE PREFERRED EMBODIMENTS

Figure 1:
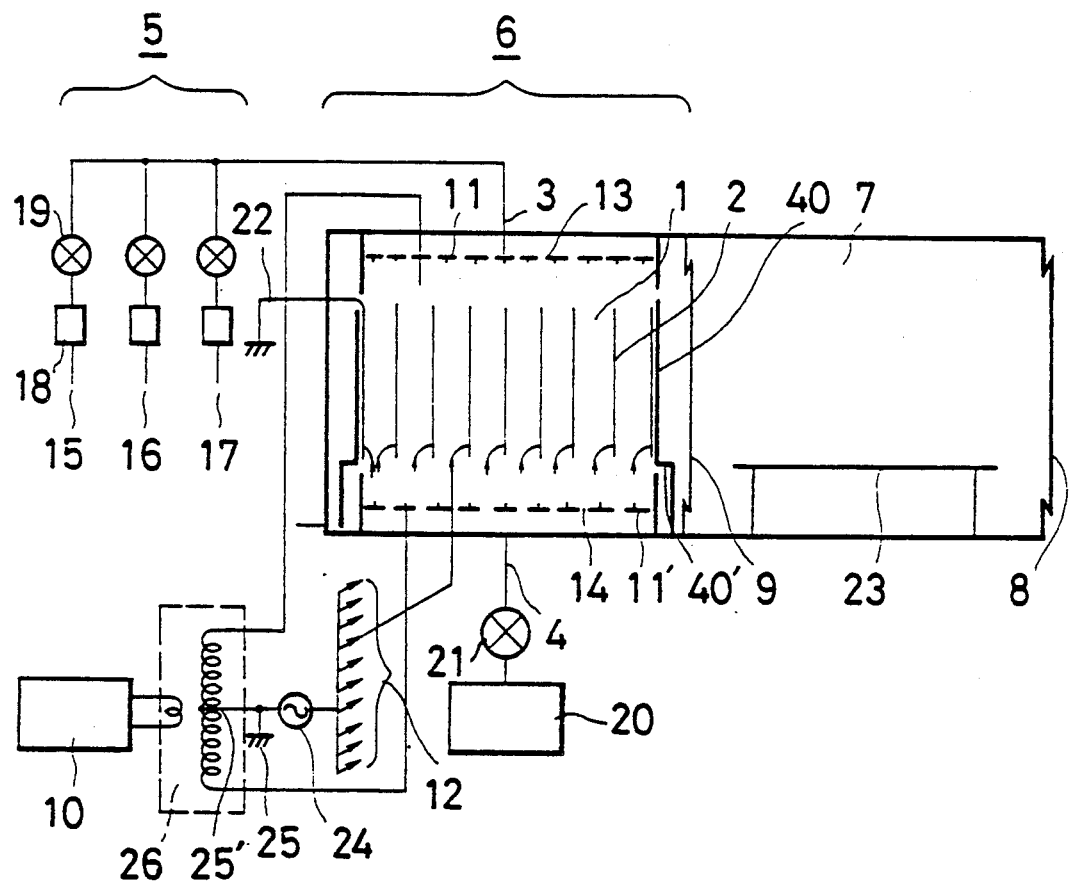
FIG. 1 is a schematic diagram showing a plasma CVD apparatus for use in embodying the present invention.

Referring now to FIGS. 1 and 2(A) to 2(C), a plasma processing method in accordance with an embodiment of the present invention is described. FIG. 1 is a shematic cross sectional diagram showing a plasma CVD apparatus. The apparatus comprises a deposition chamber 1, a loading-unloading chamber 7 coupled to the deposition chamber 1 through a gate valve 9, a pair of mesh or grid electrodes 11 and 14 provided in the deposition chamber 1, a gas feeding system 3, a vacuum pump 20 connected to the chamber 1 through a valve 21, and a high frequency power source 10 for supplying electric energy between the electrode 11 and 14 through a transformer 26. The mid point 25 of the secondary coil of the transfomer 26 is grounded. The gas feeding system includes three sets of flow rate meters 18 and valves 19. The high frequency energy inputted to the electrodes 11 and 14 causes positive column glow discharge therebetween. The glow discharge region (deposition region) is confined by a four-sided frame 40 in order to avoid undesirable deposition outside the region. The frame 40 is supported by a supporter 40 and may be a grounded metal frame or an insulating frame. Within the deposition region, a number of substrate assembly 2 are supported by the frame 40 and disposed in parallel with intervals of 3 to 13 cm, e.g. 8 cm. A plurality of IC chips are mounted on each assembly 2. AC electric energy is supplied to the assembly (the chips) from an AC source 24 through a bias device 12.

Figure 2A:
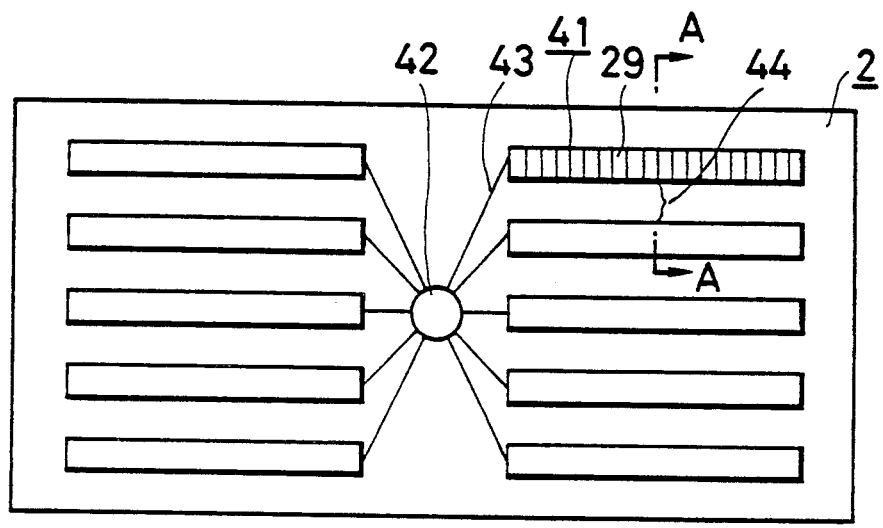
FIG. 2(A) is a schematic plan view showing an arrangement of IC chip assemblies.
Figure 2B:
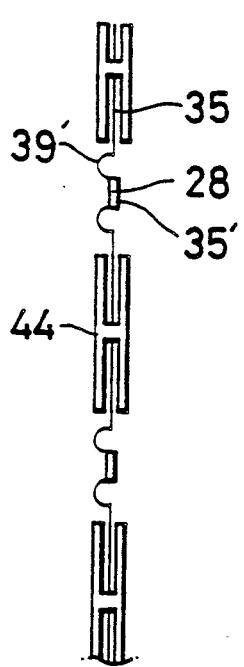
FIG. 2(B) is a partial cross sectional view taken along A—A line of FIG. 2(A).
Figure 2C:
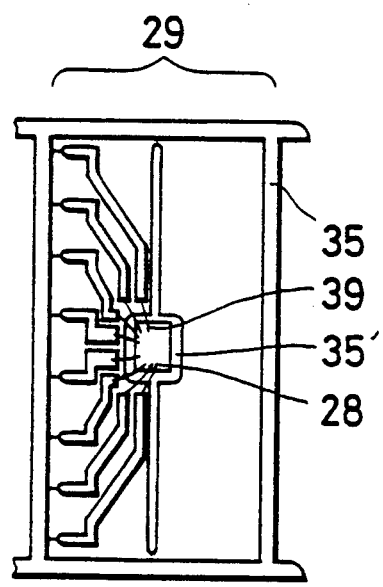
FIG. 2(C) is a partial expanded view of FIG. 2(A).

The chip assembly is comprised of holding jigs 44 and lead frames 29 interposed and supported between the adjacent jigs as illustrated in FIGS. 2(A) and 2(B). IC chips have been mounted on appropriate positions (dies) of the lead frame 29 and electrically connected with leads arranged therearound by means of Au wiring 39. FIG. 2(C) shows a unit structure of the frame corresponding to leads necessary for one chip, but the illustration of the lead in the right side of the chip is dispensed with in the figure. The unit structure repeatedly appears along the frame between the upper and lower rails of the frame. One frame contains 5 to 25 unit structures, e.g. 18 units. A number of the jigs are integrally assembled in order to support 10 to 50 frames, e.g. 10 as shown in FIG. 2(A).

Next, a protective coating process in accordance with the present invention will be explained. A number of lead frames are mounted on the assemblies 2 after completing the electrical connection between the chips and the associated leads. The assemblies are disposed in the deposition chamber at a constant interval through the loading-unloading chamber 7. $NH_3$, $Si_2H_6$ and $N_2$ (carrier gas) are leaked through a nozzle 3 into the deposition chamber 1 respectively from the introduction ports 15, 16 and 17 at appropriate pressures. The introduction molar ratio of $NH_3/Si_2H_6/N_2$ is 1/3/5. Positive column glow discharge takes place when high frequency energy is input to the pair of electrodes 11 and 14 at 1 KW and 1 to 500 MHz, e.g. 13.56 MHz. On the other hand, AC bias energy is inputted to the chips mounted on the assemblies at 100 to 500 W and 50 KHz from the AC source 24 through the bias device 12. As a result, there is deposited silicon nitride coating on the chips, the leads and the connection therebetween. The thickness of the coating reachs to 1000±200 angstroms by deposition for 10 minutes. The average deposition speed is about 3 angstrom/sec.

After completing the deposition, the assemblies are removed from the chamber and undergo moulding process. Each assembly is placed on a moulding apparatus as it is. An epoxy material (410A) is injected from the center position 42, which is depicted for explanatory purpose in FIG. 2(A), to an appropriate portion around each chip with suitable moulds and forms an external chip package. After removing the assembly from the moulding apparatus, the IC's are separated from the frames by cutting the ends of the leads. Each lead, which extends beyond the moulded structure, is then bended downwardly in order to form the legs of a "worm IC". The leads are cleaned by acid washing, followed by solder plating.

Figure 3:
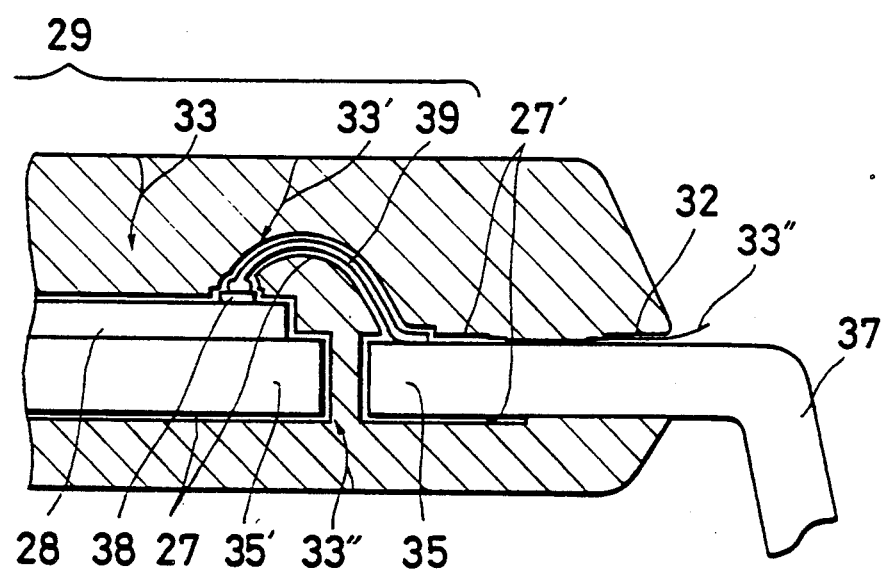
FIG. 3 is a side view of the wiring connection in the moulded structure.

The structure of the wiring connection in the moulded structure is illustrated in FIG. 3 in details. As shown in the figure, the protective film of silicon nitride is covering the surfaces of the CI chip mounted on the die 35', contacts 38, the Au wiring 39 and the leads 37. By virtue of the protective coating, the chip is protected from the attach of moisture which may invade the same through cracks 33 or gaps 33''' between the mould and the lead. Such a crack is particularly likely at the wiring (33') or at the corner edge (33"). In accordance with experiments, the IR absorbing spectrum shows a peak at 864 cm$^{-1}$ which is indicative of Si-N bondings. The withstanding voltage level of the insulating coating was measured to be $8 \times 10^6$ V/cm. The resistivity of the coating is measured to be $2 \times 10^5$ ohm centimeter. The reflective index of the coating is measured to be 1.7 to 1.8. The protection ability of the coating was evaluated by effecting HF etching. The etching speed was 3 to 10 angstrom/sec, which was substantially small as compared to the figure, about 30 angstrom/sec, of conventional silicon nitride coatings 30 angstrom/sec. The thickness of such an excellent coating may be sufficiently 1000 angstroms (300 to 5000 angstroms in general).

IC devices manufactured in accordance with the present invention were subjected to PCT (pressure cooker test) under 10 atmospheres at 150° C. for 100 hours. As a result, there was found no defective after the test, and the fraction defective was decreased from 50–100 fits to 5–10 fits. One fit means $10^{-8}$.

While several embodiments have been specifically described by way of examples, it is to be appreciated that the present invention is not limited to the particular examples described and that modifications and variations can be made without departing from the scope of the invention as defined by the appended claims. Some examples are as follow.

Diamond like carbon, silicon oxide or other insulating material can be deposited to form the protective coating. Although the embodiment was IC chips, the present invention can be applied to other electric devices, such as resistors and capacitors. Also, the present invention is effective in cases utilizing other bonding methods such as flip chip bonding and solder bump bonding.

What is claimed is:

1. A method for packaging electric parts comprising the steps of:
    placing a substrate holder into a plasma processing chamber, said holder carrying a plurality of electric parts thereon;
    performing a plasma process on a surface of said electric parts;
    removing said holder from said chamber after said plasma process;
    placing said holder carrying electric parts into a moulding apparatus; and
    packaging each of said electric parts with a moulding material in said moulding apparatus.

2. A method as in claim 1, wherein said electric parts are IC chips.

3. A method as in claim 1, wherein a protective coating is formed on a surface of said electric parts by said plasma process.

4. A method for packaging IC chips comprising the steps of forming a protective layer on a surface of IC chips by a CVD method and packaging each of said IC chips with a moulding material, wherein a common holder is used for carrying said chips throughout said CVD processing and moulding steps.

* * * * *